United States Patent [19]
Winslow et al.

[11] Patent Number: 6,018,463
[45] Date of Patent: Jan. 25, 2000

[54] LARGE NON-HERMETIC MULTICHIP MODULE PACKAGE

[75] Inventors: David T. Winslow, Los Angeles; Manny Tansavatdi, Rancho Palos Verdes, both of Calif.

[73] Assignee: Raytheon Company, Lexington, Mass.

[21] Appl. No.: 08/918,535

[22] Filed: Aug. 22, 1997

[51] Int. Cl.$^7$ .............................. H01L 23/538; H05K 1/11
[52] U.S. Cl. .......................... 361/803; 361/736; 361/760; 361/783; 361/792; 257/700; 257/704; 257/723; 438/124
[58] Field of Search ..................... 361/736, 739, 361/743, 748, 752, 753, 757, 758, 760, 762, 763, 764, 767, 782–784, 792, 796, 803, 807–809, 811, 812, 820, 772, 776; 257/678, 690, 693, 700, 704, 723, 724, 729, 730, 787; 438/106, 121, 124, 125, 126

[56] References Cited

U.S. PATENT DOCUMENTS

| | | | |
|---|---|---|---|
| 5,168,344 | 12/1992 | Ehlert et al. | 257/704 |
| 5,280,413 | 1/1994 | Pai | 361/792 |
| 5,315,486 | 5/1994 | Fillion et al. | 361/795 |
| 5,488,256 | 1/1996 | Tsunoda | 257/723 |
| 5,497,033 | 3/1996 | Fillion et al. | 257/723 |
| 5,600,181 | 2/1997 | Scott et al. | 257/723 |
| 5,751,554 | 5/1998 | Williams et al. | 361/760 |
| 5,764,484 | 6/1998 | Hoffman et al. | 361/761 |
| 5,834,705 | 11/1998 | Jonaidi | 361/792 |
| 5,869,894 | 2/1999 | Degani et al. | 257/723 |

OTHER PUBLICATIONS

Electronic Materials and Processes Handbook, 2nd ed., Harper & Sampson eds., McGraw–Hill, Inc.: Metals by Harrison et al., pp. 5.1,5.5,5.6; Thin and Thick Films by Licari, pp. 8.1,8.18–8.20, 1994.

*Primary Examiner*—Leo P. Picard
*Assistant Examiner*—John B. Vigushin
*Attorney, Agent, or Firm*—Leonard A. Alkov; Glenn H. Lenzen, Jr.

[57] ABSTRACT

A large non-hermetic packaging approach that produces a large multichip module or SuperMCM package. The present invention integrates a plurality of multichip module technologies including removable and/or standard high density multilayer interconnect (HDMI) decal substrates, and a reworkable chip on board coating, housed in a mechanically sound, thermally conductive non-hermetic multichip package. A metal substrate has an HDMI substrate and one or more edge printed wiring boards bonded thereto which are interconnected using wire bonds. The HDMI substrate has one or more electronic chips bonded thereto that are connected thereto using wire bonds or other attachment scheme. Components on the one or more edge printed wiring boards are connected to the using edge printed wiring boards wire bonds. The edge printed wiring boards have external attachment pads exposed at their outside edges. A removable cover is disposed over the package except for the external attachment pads at the edges of the package.

86 Claims, 1 Drawing Sheet

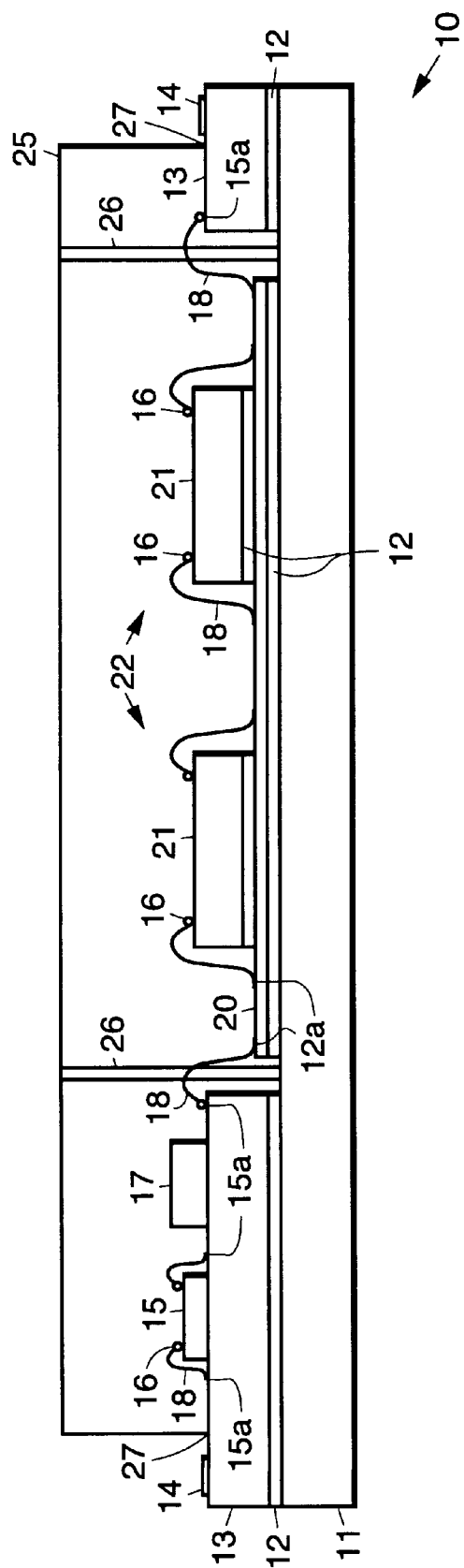

LARGE NON-HERMETIC MULTICHIP MODULE PACKAGE

BACKGROUND

The present invention relates generally to integrated circuit packaging, and more particularly, to a large non-hermetic multichip module used to package integrated circuits.

A variety of different package approaches have heretofore been developed that provide different types of integrated circuit packaging. Chip on board is an alternative to conventional environmental protection provided by passivating layers or discrete packages, but this approach does not integrate a plurality of integrated circuit packaging approaches to produce a large hermetic or non-hermetic package. Hermetic packages such as ceramic and plastic packages, for example, provide a basic structure for single or multiple integrated circuit chips, but such packages are limited in size. High density multilayer interconnect (HDMI) packages provides high density packaging of integrated circuits, but does not provide a package that integrates multiple packaging technologies. A removable high density multilayer interconnect (HDMI) decal is a packaging approach that permits removal of the HDMI decal. The SuperMCM integrates this technology into a usable product.

Therefore, it would be an advantage to have a package that provides greater size, density and reworkability than standard hermetic packages, and integrates multiple packaging approaches into a single assembly. Accordingly, it is an objective of the present invention to provide for a large non-hermetic multichip module used to package integrated circuits and integrates multiple packaging approaches into a single assembly.

SUMMARY OF THE INVENTION

To meet the above and other objectives, the present invention provides for a large non-hermetic packaging approach that produces large multichip modules, and which may be referred to as a SuperMCM package. The approach to producing the SuperMCM package of the present invention integrates a plurality of multichip module technologies including removable and/or standard high density multilayer interconnect (HDMI) decal substrates, and reworkable chip on board (COB) processes, all of which are housed in a mechanically sound, thermally conductive non-hermetic multichip package that provides a high level integration of these devices.

The present invention provides a very dense electronics package, allows larger packaging areas, and is integrated using standard electronics assembly processes. Space and cost are not wasted with hermeticity provisions. In addition, traditional packaging materials (ceramics) are replaced with much less expensive metals (aluminum). The non-hermetic package produced by the present invention does not compromise integrity as a result of the chip on board processes.

The non-hermetic SuperMCM package comprises a substrate, such as aluminum. Aluminum/silicon carbide provides a low coefficient of thermal expansion to match the coefficient of thermal expansion of electronic chips. Aluminum-beryllium may be used to provide a lower, but not matched coefficient of thermal expansion in addition to higher thermal conductivity and greater rigidity. Also, a printed wiring board may be used as the substrate. A high density multilayer interconnect is attached to the substrate that provides a mounting interface and interconnect pads for electronic chips.

Two small printed wiring boards are located at opposite edges of the package that provide a transition from wire bondable chip interconnect pads to solderable interconnect pads. The printed wiring boards have a row of external attachment pads adjacent to one edge and a row of gold plated wire bond interconnect pads adjacent the other edge. The solder pads and the wire bond pads are connected as required through interlayers of the respective printed wiring boards. The row of wire bond pads provide interconnection to the high density multilayer interconnect, and the row of external attachment pads allows conventional soldering processing to permit connection to external devices or circuits. The printed wiring boards are adhered to the substrate or to the high density multilayer interconnect.

Electronic chips are bonded to the high density multilayer interconnect and may be electrically connected using wire bonds, tape automated bonding (TAB), ball grid array or micro ball grid array, or other chip attachment scheme. Wire bonds are made between the high density multilayer interconnect and the printed wiring boards to provide electrical continuity.

The electronic chips are then coated using a chip on board coating process. A cover is then attached over the entire assembly to provide mechanical protection for the electronic chips and printed wiring boards. The cover covers all the wire bonded areas but leaves the external attachment pads exposed at the edges of the package, to protect the wire bonds from mechanical damage, and provide a solderable interface to the remainder of the circuitry. The cover may be comprised of any suitable material, such as plastic, metals, or composite material. Stiffeners and standoffs may be used to prevent the cover from deflecting under load and damaging the internal components. The cover has a small lip to allow its removal.

The package may also have wire bondable pads on the outside in place of or in addition to the external attachment pads to provide for ribbon bonding. The printed wiring board at the one edge of the package is not absolutely required. Additional printed wiring boards may be used to provide test access or other harnessing connections to the outside of the package or to connect to a ring frame.

BRIEF DESCRIPTION OF THE DRAWINGS

The various features and advantages of the present invention may be more readily understood with reference to the following detailed description taken in conjunction with the accompanying drawing FIGURE which illustrates a large non-hermetic package, or SuperMCM package, in accordance with the principles of the present invention.

DETAILED DESCRIPTION

Referring to the sole drawing FIGURE, it illustrates an exemplary large non-hermetic package 10, or SuperMCM package 10, in accordance with the principles of the present invention. The large non-hermetic package 10, or SuperMCM package 10, integrates a plurality of multichip module technologies including removable and/or standard high density multilayer interconnect (HDMI) decal substrates 20, and reworkable chip on board (COB) processes, all of which are housed in a mechanically sound, thermally conductive non-hermetic multichip package that provides for high level integration of these devices.

The large non-hermetic package 10, or SuperMCM package 10, comprises a substrate 11. The substrate 11 may be comprised of aluminum. In one particular reduced to practice embodiment, the substrate 11 has dimensions of approximately 6 inches by 6 inches. The thickness of the non-hermetic SuperMCM package may be approximately 0.025 inches thick.

However, it is to be understood that other materials may be used as the substrate 11. An aluminum/silicon carbide substrate 11 is an excellent choice, providing a low coefficient of thermal expansion that matches the coefficient of thermal expansion of the electronic chips. An aluminum-beryllium substrate 11 also provides a lower, but not matched coefficient of thermal expansion in addition to higher thermal conductivity and greater rigidity. The materials that may be used to form the substrate 11 are not restricted to these particular materials. Custom materials may also be used as their properties merit. Also, a printed wiring board may be used as the substrate 11.

A high density multilayer interconnect 20 is attached either directly to the substrate 11 or is bonded to the substrate 11 using adhesive 12. The high density multilayer interconnect 20 provides a mounting interface and interconnect pads 12a for electronic (integrated circuit) chips 21 that are mounted thereto.

Two relatively small printed circuit boards 13, or printed wiring boards 13, are located at opposite edges of the SuperMCM package 10. These printed wiring boards provide a transition from chip interconnect pads 15a that are used to wire bond to various components including active components 15 such as operational amplifiers 15 or integrated circuits 15, and passive components 17 such as capacitors 17 and resistors 17 to (solderable) external attachment pads 14.

The printed wiring boards 13 have a row of external attachment pads 14 adjacent one edge and a row of gold plated wire bond interconnect pads 15a adjacent the other edge. The external attachment pads 14 and the wire bond interconnect pads 15 are connected in a conventional manner as required through intermediate layers (not shown) of the respective printed wiring boards 13. The row of wire bond interconnect pads 15 provide interconnection to the high density multilayer interconnect 20 by way of electrical interconnects 18, such as wire bonds 18, for example, while the row of external attachment pads 14 allow conventional soldering processing to be used to connect to external circuits or devices (not shown). The printed wiring boards 13 are bonded with an adhesive 12 to the substrate 11. The printed wiring boards 13 may also be bonded to the high density multilayer interconnect depending upon the circuit design.

The electronic integrated circuit chips 21 or die 21 are bonded to the high density multilayer interconnect 20 using adhesive 12 and may be electrically connected to interconnect pads 12a of the high density multilayer interconnect 20 with wire bonds 18, tape automated bonding (TAB), ball grid array or micro ball grid array, or other chip attachment scheme. In addition, wire bonds 18 are made between the high density multilayer interconnect 20 and the interconnect pads 15a of the printed wiring boards 13, as required, to provide electrical continuity.

At this point, the SuperMCM package 10 is an open faced package, and may be electrically tested at this level of completeness. After electrical test, as required, the electronic integrated circuit chips 21 are coated with a chip on board coating 22 using a chip on board coating process developed by the assignee of the present invention. A suitable chip on board coating process is disclosed in U.S. patent application Ser. No. 08/761,268, filed Dec. 6, 1996, and assigned to the assignee of the present invention.

A cover 25 is then placed substantially over the entire assembly to provide mechanical protection for the electronic integrated circuit chips 21, the high density multilayer interconnect 20, and the printed wiring boards 13. The cover 25 is disposed over all areas containing the electrical interconnects 18 (wire bonds 18) but leaves the external attachment pads 14 exposed at the edges of the package 10, thus protecting the wire bonds 18 from mechanical damage, but providing a solderable interface to external circuits or other devices. The cover 25 may be comprised of any suitable material, such as plastic, metal, or composite material. The cover 25 is bonded to prevent entrapment of contaminating matter. Stiffeners and standoffs 26 may be used to prevent the cover 25 from deflecting under load and damaging the internal components. The cover 25 has a small lip 27 to permits its removal.

Variations of the packaging approach provided by the present invention may be made that do not disturb the basic structure of the invention. For example, the package 10 may have wire bondable interconnect pads 15a on the outside in place of or in addition to the external attachment pads 14 to provide for ribbon bonding instead of solder bonding. The printed wiring board 13 at the one edge of the package 10 is not absolutely required. Additional printed wiring boards 13 may be used to provide test access or other harnessing connections to the outside of the package 10 or to connect to a ring frame (not shown).

The SuperMCM package 10 of the present invention has been reduced to practice in the form of a 6 inch by 6 inch by 00210 inch package 10. The SuperMCM package 10 has also been designed to provide an electrical interface to a Common Integrated Processor developed by the assignee of the present invention.

The present invention provides a very dense packaging approach for electronics devices and allows larger packaging areas, while integrating the devices using cost-effective electronics assembly processes. Space and cost are saved by making the package non-hermetic. In addition, traditional packaging materials (ceramics) are replaced with much less expensive metal (aluminum or metal alloy) substrates 11. The non-hermetic package 10 produced by the present invention does not compromise integrity as a result of the chip on board processes used to provide the coating 22.

Thus, large non-hermetic multichip module package for housing integrated circuits that integrates multiple packaging approaches into a single assembly has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A large non-hermetic package comprising:
   a substrate comprising a first printed wiring board;
   a high density multilayer interconnect attached to the substrate;
   a second printed wiring board disposed at an edge of the package that is bonded with an adhesive to the substrate, and that has a plurality of external attachment pads adjacent one edge and a plurality of interconnect pads adjacent the other edge wherein said second printed wiring board provides a transition from the plurality of interconnect pads to said external attachment pads that are used to interconnect to electronic components located on said second printed wiring board;

electronic integrated circuit chips attached to the high density multilayer interconnect;

a plurality of electrical interconnects interconnecting the interconnect pads to the electronic components, and interconnecting interconnect pads of the high density multilayer interconnect to the electronic integrated circuit chips;

a chip on board coating disposed on the electronic integrated circuit chips and wire bonds; and a cover disposed over the package except for the external attachment pads exposed at the edge of the package.

2. The package of claim 1 wherein the substrate comprises aluminum.

3. The package of claim 1 wherein the substrate comprises aluminum/silicon carbide.

4. The package of claim 3 wherein the substrate comprises aluminum-beryllium.

5. The package of claim 1 wherein the high density multilayer interconnect is bonded to the substrate using adhesive.

6. The package of claim 1 wherein selected external attachment pads and interconnect pads are interconnected together.

7. The package of claim 1 wherein the second printed wiring board is bonded to the high density multilayer interconnect.

8. The package of claim 1 wherein the cover is comprised of metal.

9. The package of claim 1 wherein the cover is comprised of composite material.

10. The package of claim 1 wherein the external attachment pads comprise solder interconnect pads.

11. The package of claim 1 wherein the external attachment pads comprise wire bondable pads.

12. A large non-hermetic package comprising:

a substrate;

a high density multilayer interconnect attached to the substrate;

a first printed wiring board disposed at a first edge of the package that is bonded with an adhesive to the substrate, and that has a plurality of external attachment pads adjacent one edge and a plurality of interconnect pads adjacent the other edge wherein said first printed wiring board provides a transition from the plurality of interconnect pads to said external attachment pads that are used to interconnect to electronic components located on said first printed wiring board;

a second printed wiring board disposed at a second edge of the package;

electronic integrated circuit chips attached to the high density multilayer interconnect;

a plurality of electrical interconnects interconnecting the interconnect pads to the electronic components, and interconnecting interconnect pads of the high density multilayer interconnect to the electronic integrated circuit chips;

a chip on board coating disposed on the electronic integrated circuit chips and wire bonds; and a cover disposed over the package except for the external attachment pads exposed at the edge of the package.

13. The package of claim 12 wherein the substrate comprises aluminum.

14. The package of claim 12 wherein the substrate comprises aluminum/silicon carbide.

15. The package of claim 14 wherein the substrate comprises aluminum-beryllium.

16. The package of claim 12 wherein the high density multilayer interconnect is bonded to the substrate using adhesive.

17. The package of claim 12 wherein selected external attachment pads and interconnect pads are interconnected together.

18. The package of claim 12 wherein the first printed wiring board is bonded to the high density multilayer interconnect.

19. The package of claim 12 wherein the cover is comprised of metal.

20. The package of claim 12 wherein the cover is comprised of composite material.

21. The package of claim 12 wherein the external attachment pads comprise solder interconnect pads.

22. The package of claim 12 wherein the external attachment pads comprise wire bondable pads.

23. A large non-hermetic package comprising:

a substrate;

a high density multilayer interconnect attached to the substrate;

a printed wiring board disposed at an edge of the package that is bonded with an adhesive to the substrate, and that has a plurality of external attachment pads adjacent one edge and a plurality of interconnect pads adjacent the other edge wherein said printed wiring board provides a transition from the plurality of interconnect pads to said external attachment pads that are used to interconnect to electronic components located on said printed wiring board;

electronic integrated circuit chips attached to the high density multilayer interconnect;

a plurality of electrical interconnects interconnecting the interconnect pads to the electronic components, and interconnecting interconnect pads of the high density multilayer interconnect to the electronic integrated circuit chips;

a chip on board coating disposed on the electronic integrated circuit chips and wire bonds; and a plastic cover disposed over the package except for the external attachment pads exposed at the edge of the package.

24. The package of claim 23 wherein the substrate comprises aluminum.

25. The package of claim 23 wherein the substrate comprises aluminum/silicon carbide.

26. The package of claim 25 wherein the substrate comprises aluminum-beryllium.

27. The package of claim 23 wherein the high density multilayer interconnect is bonded to the substrate using adhesive.

28. The package of claim 23 wherein selected external attachment pads and interconnect pads are interconnected together.

29. The package of claim 23 wherein the printed wiring board is bonded to the high density multilayer interconnect.

30. The package of claim 23 wherein the external attachment pads comprise solder interconnect pads.

31. The package of claim 23 wherein the external attachment pads comprise wire bondable pads.

32. A large non-hermetic package comprising:

a substrate;

a high density multilayer interconnect attached to the substrate;

a printed wiring board disposed at an edge of the package that is bonded with an adhesive to the substrate, and that has a plurality of external attachment pads adjacent one edge and a plurality of interconnect pads adjacent the other edge wherein said printed wiring board provides a transition from the plurality of interconnect pads to said external attachment pads that are used to interconnect to electronic components located on said printed wiring board;
electronic integrated circuit chips attached to the high density multilayer interconnect;
a plurality of electrical interconnects interconnecting the interconnect pads to the electronic components, and interconnecting interconnect pads of the high density multilayer interconnect to the electronic integrated circuit chips;
a chip on board coating disposed on the electronic integrated circuit chips and wire bonds; and
a cover bonded to the printed wiring board and substrate, wherein said cover is disposed over the package except for the external attachment pads exposed at the edge of the package.

33. The package of claim 32 wherein the substrate comprises aluminum.

34. The package of claim 32 wherein the substrate comprises aluminum/silicon carbide.

35. The package of claim 34 wherein the substrate comprises aluminum-beryllium.

36. The package of claim 32 wherein the high density multilayer interconnect is bonded to the substrate using adhesive.

37. The package of claim 32 wherein selected external attachment pads and interconnect pads are interconnected together.

38. The package of claim 32 wherein the printed wiring board is bonded to the high density multilayer interconnect.

39. The package of claim 32 wherein the cover is comprised of metal.

40. The package of claim 32 wherein the cover is comprised of composite material.

41. The package of claim 32 wherein the external attachment pads comprise solder interconnect pads.

42. The package of claim 32 wherein the external attachment pads comprise wire bondable pads.

43. A large non-hermetic package comprising:
a substrate;
a high density multilayer interconnect attached to the substrate;
a printed wiring board disposed at an edge of the package that is bonded with an adhesive to the substrate, and that has a plurality of external attachment pads adjacent one edge and a plurality of interconnect pads adjacent the other edge wherein said printed wiring board provides a transition from the plurality of interconnect pads to said external attachment pads that are used to interconnect to electronic components located on said printed wiring board;
electronic integrated circuit chips attached to the high density multilayer interconnect;
a plurality of electrical interconnects interconnecting the interconnect pads to the electronic components, and interconnecting interconnect pads of the high density multilayer interconnect to the electronic integrated circuit chips;
a chip on board coating disposed on the electronic integrated circuit chips and wire bonds; and
a cover comprising a lip that permits its removal disposed over the package except for the external attachment pads exposed at the edge of the package.

44. The package of clam 43 wherein the substrate comprises aluminum.

45. The package of claim 43 wherein the substrate comprises aluminum/silicon carbide.

46. The package of claim 45 wherein the substrate comprises aluminum-beryllium.

47. The package of claim 43 wherein the high density multilayer interconnect is bonded to the substrate using adhesive.

48. The package of claim 43 wherein selected external attachment pads and interconnect pads are interconnected together.

49. The package of claim 43 wherein the printed wiring board is bonded to the high density multilayer interconnect.

50. The package of claim 43 wherein the cover is comprised of metal.

51. The package of claim 43 wherein the cover is comprised of composite material.

52. The package of claim 43 wherein the external attachment pads comprise solder interconnect pads.

53. The package of claim 43 wherein the external attachment pads comprise wire bondable pads.

54. A large non-hermetic package comprising:
a substrate;
a high density multilayer interconnect attached to the substrate;
a printed wiring board disposed at an edge of the package that is bonded with an adhesive to the substrate, and that has a plurality of external attachment pads adjacent one edge and a plurality of bondable interconnect pads adjacent the other edge wherein said printed wiring board provides a transition from the plurality of bondable interconnect pads to said external attachment pads that are used to interconnect to electronic components located on said printed wiring board, wherein said bondable interconnect pads and said external attachment pads provide for ribbon bonding and solder bonding of the package;
electronic integrated circuit chips attached to the high density multilayer interconnect;
a plurality of electrical interconnects interconnecting the interconnect pads to the electronic components, and interconnecting interconnect pads of the high density multilayer interconnect to the electronic integrated circuit chips;
a chip on board coating disposed on the electronic integrated circuit chips and wire bonds; and
a cover disposed over the package except for the external attachment pads exposed at the edge of the package.

55. The package of claim 54 wherein the substrate comprises aluminum.

56. The package of claim 54 wherein the substrate comprises aluminum/silicon carbide.

57. The package of claim 56 wherein the substrate comprises aluminum-beryllium.

58. The package of claim 54 wherein the high density multilayer interconnect is bonded to the substrate using adhesive.

59. The package of claim 54 wherein selected external attachment pads and interconnect pads are interconnected together.

60. The package of claim 54 wherein the printed wiring board is bonded to the high density multilayer interconnect.

61. The package of claim 54 wherein the cover is comprised of metal.

62. The package of claim 54 wherein the cover is comprised of composite material.

63. The package of claim 54 wherein the external attachment pads comprise solder interconnect pads.

64. The package of claim 54 wherein the external attachment pads comprise wire bondable pads.

65. A large non-hermetic package comprising:

a substrate;

a high density multilayer interconnect attached to the substrate;

a printed wiring board disposed at an edge of the package that is bonded with an adhesive to the substrate, and that has a plurality of external attachment pads adjacent one edge and a plurality of interconnect pads adjacent the other edge wherein said printed wiring board provides a transition from the plurality of interconnect pads to said external attachment pads that are used to interconnect to electronic components located on said printed wiring board;

electronic integrated circuit chips attached to the high density multilayer interconnect;

a plurality of electrical interconnects interconnecting the interconnect pads to the electronic components, and interconnecting interconnect pads of the high density multilayer interconnect to the electronic integrated circuit chips;

a chip on board coating disposed on the electronic integrated circuit chips and wire bonds;

a cover disposed over the package except for the external attachment pads exposed at the edge of the package; and a stiffener means for preventing the cover from deflecting under load.

66. The package of claim 65 wherein the substrate comprises aluminum.

67. The package of claim 65 wherein the substrate comprises aluminum/silicon carbide.

68. The package of claim 67 wherein the substrate comprises aluminum-beryllium.

69. The package of claim 65 wherein the high density multilayer interconnect is bonded to the substrate using adhesive.

70. The package of claim 65 wherein selected external attachment pads and interconnect pads are interconnected together.

71. The package of claim 65 wherein the printed wiring board is bonded to the high density multilayer interconnect.

72. The package of claim 65 wherein the cover is comprised of metal.

73. The package of claim 65 wherein the cover is comprised of composite material.

74. The package of claim 65 wherein the external attachment pads comprise solder interconnect pads.

75. The package of claim 65 wherein the external attachment pads comprise wire bondable pads.

76. A large non-hermetic package comprising:

a substrate;

a high density multilayer interconnect attached to the substrate;

a printed wiring board disposed at an edge of the package that is bonded with an adhesive to the substrate, and that has a plurality of external attachment pads adjacent one edge and a plurality of interconnect pads adjacent the other edge wherein said printed wiring board provides a transition from the plurality of interconnect pads to said external attachment pads that are used to interconnect to electronic components located on said printed wiring board;

electronic integrated circuit chips attached to the high density multilayer interconnect;

a plurality of electrical interconnects interconnecting the interconnect pads to the electronic components, and interconnecting interconnect pads of the high density multilayer interconnect to the electronic integrated circuit chips;

a chip on board coating disposed on the electronic integrated circuit chips and wire bonds;

a cover disposed over the package except for the external attachment pads exposed at the edge of the package; and standoff means to prevent the cover from deflecting under load.

77. The package of claim 76 wherein the substrate comprises aluminum.

78. The package of claim 76 wherein the substrate comprises aluminum/silicon carbide.

79. The package of claim 78 wherein the substrate comprises aluminum-beryllium.

80. The package of claim 76 wherein the high density multilayer interconnect is bonded to the substrate using adhesive.

81. The package of claim 76 wherein selected external attachment pads and interconnect pads are interconnected together.

82. The package of claim 76 wherein the printed wiring board is bonded to the high density multilayer interconnect.

83. The package of claim 76 wherein the cover is comprised of metal.

84. The package of claim 76 wherein the cover is comprised of composite material.

85. The package of claim 76 wherein the external attachment pads comprise solder interconnect pads.

86. The package of claim 76 wherein the external attachment pads comprise wire bondable pads.

* * * * *